Dec. 28, 1965 K. REUSCHEL ET AL 3,226,265

METHOD FOR PRODUCING A SEMICONDUCTOR DEVICE WITH A MONOCRYSTALLINE SEMICONDUCTOR BODY

Filed March 28, 1962

3,226,265

METHOD FOR PRODUCING A SEMICONDUCTOR DEVICE WITH A MONOCRYSTALLINE SEMICONDUCTOR BODY

Konrad Reuschel and Wolfgang Keller, Pretzfeld, Upper Franconia, Germany, assignors to Siemens-Schuckertwerke Aktiengesellschaft, Erlangen, Germany, a corporation of Germany Filed Mar. 28, 1962, Ser. No. 183,106
Claims priority, application Germany, Mar. 30, 1961, S 73,259
1 Claim. (Cl. 148—1.5)

Figure 1:
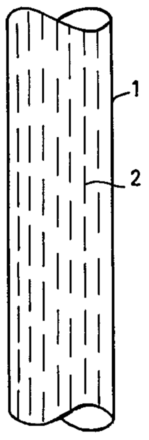

Our invention relates to semiconductor devices such as rectifiers, transistors, photodiodes, consisting of an essentially monocrystalline main body of germanium, silicon or an intermetallic compound of elements from the third and fifth groups of the periodic system with electrodes joined with the semiconductor body.

The electrodes can be joined to the semiconductor body in different ways, for example by a diffusion method or an alloying method. The alloying method, as a rule, is performed by placing a foil of doping substance or a foil of material that contains the doping substance, onto a disc of semiconductor material and then alloying the foil together with the semiconductor material by means of a heat treatment. This results in the formation of a liquid alloy from which, during subsequent freezing, a small portion of the doping substance remains in the first recrystallizing semiconductor material whereas the residual melt solidifies in a eutectic constitution. Thus, there occurs in the semiconductor body a highly doped recrystallization region with an adjacent layer of the alloy material containing some semiconductor material in solution.

As a rule a metal body is placed upon and alloyed into a semiconductor surface possessing a (111) orientation. For example, semiconductor bodies of silicon or germanium are produced by fusing a crystal seed with (111) orientation to a rod-shaped semiconductor body and then subjecting the semiconductor rod to crucible-free zone melting. In this manner a monocrystalline semiconductor body is produced whose longitudinal axis possesses (111) orientation. By moving the two rod-end holders toward or away from each other the cross section of the semiconductor rod can be varied in such a manner that the semiconductor discs subsequently cut from the rod perpendicularly to the rod axis have the size required for electronic semiconductor devices. The flat sides of such semiconductor discs, having for example a diameter of 20 to 25 mm. and a thickness of 150 to 300 microns, are placed in contact with metal foils which are alloyed into the semiconductor disc by a heating process.

In the endeavor toward always improved electronic semiconductor devices, the semiconductor material used for such purposes has been given increasingly better electronic properties. Thus, it has recently become possible to produce completely dislocation-free semiconductor material. Such material has the advantage that impurities, normally penetrating into the material at high diffusion speed when using semiconductor material possessing dislocations, do not find any predetermined travel paths, such impurities being constituted for example by copper, gold or lithium.

It has been found, however, that certain difficulties are encountered when using such dislocation-free material in the production of metal-contacted semiconductor bodies for electronic devices. One of these difficulties is due to the fact that when semiconductor devices are made of dislocation-free material with the aid of the alloying method, the (111) surfaces, which heretofore have been preferably employed, exhibit the phenomenon that the alloying material, during the heating treatment, will spread out preferentially on such surfaces. This virtually prevents an exactly defined limitation or definition of the resulting electrode surface. Complicated electrode patterns, for example the concentric arrangement of emitter and base rings on the semiconductor bodies of power transistors, are virtually infeasible with such a dislocation-free semiconductor material because of the slight spacing between the individual electrodes.

It is an object of our invention to eliminate such difficulties as heretofore encountered in the production of electronic semiconductor devices with a monocrystalline semiconductor body and at least one p-n junction in which a metal body is placed in contact with the surface of the semiconductor body and is alloyed into that body by a heating process.

According to the invention, we use for such production a semiconductor body of perfectly dislocation-free material and alloy the metal body into a semiconductor surface with respect to which all (111) faces of the monocrystal have a sloping direction. For example, the metal-contacted and alloyed surface of the semiconductor body may be a (100), (110) or a (112) face of the monocrystalline semiconductor body.

We have found that the (110), (112) and (100) faces of dislocation-free semiconductor bodies do not possess the above-mentoined disadvantage of causing a contacting and alloying material to spread over the adjacent semiconductor surface. That is, metal foils placed upon the semiconductor body and alloyed into the body no longer exhibit the detrimental tendency to increase in width, for example, with a (100) or (110) orientation of the semiconductor surface. The alloy rather remains limited to the location upon which the metal foil was placed.

At this time it is still difficult to produce completely dislocation-free semiconductor material. However, a method for producing such a material is described, for example, in the copending application, Serial No. 157,033, filed November 24, 1961, by Keller et al., assigned to the assignee of the present invention. In most cases such a dislocation-free material still possesses the (111) orientation of the rod axis. In this case, therefore, the semiconductor discs to be used for the production of electronic semiconductor devices cannot be obtained by cutting the semiconductor rod in directions perpendicular to the rod axis. The cuts must rather be placed in planes extending in a slanting direction or parallel to the rod axis. From the resulting semiconductor slabs, the required disc-shaped semiconductor bodies can then be cut and can be used further for the method according to the invention.

The invention will be further described with reference to an example using a silicon rod prepared in accordance with the above-mentioned application, Serial No. 157,033, having a diameter of approximately 18 mm. and being perfectly free of dislocations.

Figure 2:
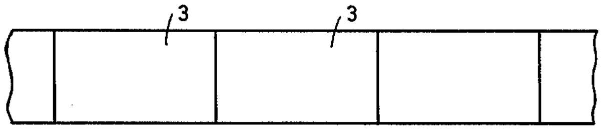
Figure 3:
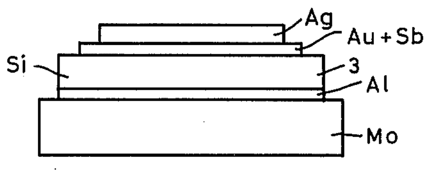

FIG. 1 of the accompanying drawing shows schematically a portion of such a rod, FIG. 2 shows a number of semiconductor discs as can be cut from a slab made from such a rod; and FIG. 3 shows a semiconductor device made according to the invention.

As mentioned, the longitudinal axis of the rod 1 (FIG. 1) is coincident with the (111) axis of the monocrystal. By cutting the rod parallel to the rod's axis symmetry, as indicated by broken lines 2 in FIG. 1, a number of slabs are obtained, each of which have a width of 18 mm. or less. From such slabs, individual pieces, for example of 20 mm. length are severed as shown in FIG. 2. Subsequently, the two flat sides of such discs, which in any event do not possess (111) orientation, are made perfectly parallel to each other by a lapping operation and thus reduced to a desired thickness of about 200 microns. After these mechanical machining operations the semiconductor discs are subjected to etching. The dislocation-free material then exhibits the advantage that the etching effect merely eliminates the disturbed surface layers and then essentially comes to a standstill. With material affected by dislocations the etching progresses at the dislocation points practically continuously. The etching in the case of silicon can be effected with, for example, a so-called CP etching solution consisting essentially of 40% hydrofluoric acid and fuming nitric acid, for example in 1:1 ratio.

Gold foils containing doping material can thereafter be alloyed into the flat sides of the semiconductor disc thus treated. For example, a gold foil containing antimony (0.5% Sb) can be alloyed into the lower side of the semiconductor disc and the gold foil containing boron (0.03% B) can be alloyed into the top side. Such gold foils may, for example, have a thickness of 50 microns. The area of the gold foils depends upon the size of the semiconductor disc being fused.

The alloying of a semiconductor disc with the gold-foil electrodes can be effective in any suitable known manner. It is of advantage to imbed the semiconductor disc with the gold foils and, if desired a further alloying component such as a carrier plate consisting for example of molybdenum, into a non-melting powder of substance that does not react with the constituents of the alloy. Graphite, for example, is suitable as such an imbedding powder. The assembly can then be pressed together in the powder imbedment and can be heated under pressure to the necessary alloying temperature. In the above-described example, the alloying temperature is above the eutectic temperature of gold and silicon (approximately 370° C.), for example, 600° C. being a suitable alloying temperature. Other semiconductor devices may contain electrode foils of aluminum or indium, in which cases correspondingly different temperatures are to be employed. Thus, an alloying temperature of about 800° C. is applicable for alloying aluminum foils to silicon.

FIG. 3 shows a device prepared in accordance with our invention. A dislocation-free silicon disc 3, having a crystallographic orientation other than in the (111) direction has on its lower surface an aluminum foil electrode 5 and on its upper surface an antimony-containing gold foil electrode 4. As a result of the electrodes a p-n junction is formed adjacent to the gold electrode by diffusion of the doping material from the doped gold foil. Adjacent to the gold electrodes are contact or carrier plates 6 and 7 which may consist of silver and molybdenum respectively.

Obviously many modifications and variations of the present invention are possible in the light of the above teachings. It is therefore to be understood that within the scope of the appended claim, the invention may be practiced otherwise than as specifically described.

We claim:

The method of producing an electronic semiconductor device, which comprises providing a monocrystalline silicon dislocation-free semiconductor body having a p-n junction therein and a planar surface with an orientation selected from those of (110), (112) and (100), contacting said surface with an antimony doped gold foil, heating under pressure to cause the foil to alloy to the semiconductor body, whereby spreading of alloying material is prevented.

References Cited by the Examiner

UNITED STATES PATENTS

| | | | |
|---|---|---|---|
| 2,959,501 | 11/1960 | Schink et al. | 148—1.5 |
| 2,971,869 | 2/1961 | Taylor | 148—179 X |
| 2,974,074 | 3/1961 | Herlet et al. | 148—1.5 |
| 3,050,667 | 8/1962 | Emeis | 148—1.5 X |
| 3,060,018 | 10/1962 | Desmond | 148—1.5 X |

OTHER REFERENCES

Roschen et al.: "Alloying With Controlled Spreading in Silicon Transistor—Part I," Semiconductor Products, August 1959, pages 41–45.

"Silicon Crystals Free of Dislocation," Journal of Applied Physics, pages 736 and 737, vol. 29, 1958.

DAVID L. RECK, *Primary Examiner.*